United States Patent
Ohno et al.

[11] Patent Number: 6,146,734
[45] Date of Patent: Nov. 14, 2000

[54] OPTICAL RECORDING DISK AND METHOD FOR MANUFACTURING THE SAME

[75] Inventors: Eiji Ohno, Hirakata; Yoshitaka Sakaue, Nara; Kenichi Nagata, Minou; Nobuo Akahira, Yawata; Masahide Yokoyama, Hirakata; Hiroshi Hayata, Katano; Noboru Yamada, Hirakata, all of Japan

[73] Assignee: Matsushita Electric Industrial Co., Osaka, Japan

[21] Appl. No.: 09/459,453

[22] Filed: Dec. 13, 1999

Related U.S. Application Data

[60] Division of application No. 08/477,628, Jun. 7, 1995, Pat. No. 6,033,535, which is a continuation-in-part of application No. 08/137,221, Oct. 18, 1993, abandoned, which is a continuation of application No. 07/750,481, Aug. 27, 1991, abandoned.

[30] Foreign Application Priority Data

Aug. 28, 1990 [JP] Japan .................................. 2-227026
Apr. 20, 1995 [JP] Japan .................................. 7-094861

[51] Int. Cl.[7] .................................................. B32B 3/02
[52] U.S. Cl. .................. 428/64.1; 428/64.4; 428/64.5; 428/64.6; 428/913; 430/270.13; 430/495.1; 430/945; 369/283; 369/288
[58] Field of Search ................... 428/64.1, 64.2, 428/64.4, 64.5, 64.6, 913; 430/270.13, 495.1, 945; 369/283, 288

[56] References Cited

U.S. PATENT DOCUMENTS

| | | |
|---|---|---|
| 4,367,257 | 1/1983 | Arai et al. . |
| 4,576,699 | 3/1986 | Sato et al. . |
| 4,626,336 | 12/1986 | Bloomquist et al. . |
| 4,640,755 | 2/1987 | Sato . |
| 4,929,320 | 5/1990 | Yamada et al. . |
| 4,946,241 | 8/1990 | Krumme et al. . |
| 5,108,846 | 4/1992 | Steininger . |
| 5,395,735 | 3/1995 | Nagata et al. . |
| 5,923,639 | 7/1999 | Yasuda et al. ................ 369/275.2 |
| 5,935,672 | 8/1999 | Zhou et al. ................... 428/64.1 |

FOREIGN PATENT DOCUMENTS

| | | |
|---|---|---|
| 63-142542 | 6/1988 | Japan . |
| 64-62466 | 3/1989 | Japan . |
| 1-184742 | 7/1989 | Japan . |
| 1-301857 | 12/1989 | Japan . |
| 3-52137 | 3/1991 | Japan . |

OTHER PUBLICATIONS

Kay et al., "Controlled Sputtering Process," *IBM Technical Dis. Bulletin*, vol. 12, No. 9, p. 1358 (Feb. 1970).

*Primary Examiner*—Elizabeth Evans
*Attorney, Agent, or Firm*—Wenderoth, Lind & Ponack, LLP.

[57] ABSTRACT

The present invention is to provide a method for manufacturing the PCE optical information recording disk under control of not only the crystallization velocity but also the complex index of refraction and thus the reflectance on the disk surface.

The PCE optical information recording disk is suitable to be used under the constant angular velocity (the constant rotational numbers wherein the disk has a characteristic that the crystallization velocity is designed to become faster from inside area of the disk to outside area in the radical direction thereof under control of not only the crystallization velocity but also the complex index of refraction and thus the reflectance on the disk surface.

In the case of mass production and high film formation to be required, the present invention provides an effective method for manufacturing the optical disk by means of sputtering from at least two targets at the same time in a manner that the crystallization velocity is increased in a radial direction from inside area to outside area in the disk.

7 Claims, 14 Drawing Sheets

OPTICAL RECORDING DISK AND METHOD FOR MANUFACTURING THE SAME

This application is a divisional application of Ser. No. 08/477,628, filed Jun. 7, 1995, now U.S. Pat. No. 6,033,535 issued Mar. 7, 2000, which is a continuation in part application of Ser. No. 08/137,221, filed on Oct. 18, 1993, now abandoned, which is a continuation of Ser. No. 07/750,481, filed Aug. 27, 1991, now abandoned.

BACKGROUND OF THE INVENTION

This invention relates to an optical recording disk, especially to a phase-change erasable type system and also relates to a method and apparatus for manufacturing the same.

Erasable optical disk systems will embody all of the attributes of write-one and have the capability of direct file replacement of current magnetic systems. Full realization of the potential of optical disk systems awaits the availability of erasable systems.

Nowadays, two major families of erasable media are available: one is 1) phase-change erasable (PCE) system and the other 2) magnetooptical (MO) erasable system. Data recording on PCE media relies on the transition from a crystalline phase to an amorphous phase. On the other hand, MO recording utilizes the polarization of the laser beam magnetically modulated in media which display the Kerr effect. The principal characteristics of erasable disk are shown in the below Table.

TABLE

|  | PCE | MO |
| --- | --- | --- |
| Recording and erasing mode | Phase change | Change of magnetization |
| Read | Change of amplitude | Change of polarization |
| Material of medium | Te—Ge—Sb | Tb—Fe—Ni—Co |
| Operation mechanism | Simple | Complicated |
| Magnetic field | Not required | Required |
| Reversibility | Fair | Good |
| Require laser power | High | Medium |

In MO systems, there are four representative references as the prior art; Firstly, Yamada'320 shows that targets can be alloy formed of TbFeCo or one of the targets is formed Fe and the other target can be TbCo. The method is carried out by combination of Rf sputtering and DC sputtering, the former makes a resulting layer to have a high density and thus be strongly adhesive to a base metal while the latter makes the resulting layer to be formed at a higher velocity and a lower temperature. Secondly, Sato'755 shows that a magnetic recording material can be formed by simultaneous sputtering from Tb target and FeCo target. Thirdly, Japanese patent Tokkaihei 1-184742 shows that a magneto-optical material can be formed by simultaneous sputtering from different compositional TbFeCo alloy targets. Fourthly, Steininger'846 shows a method for preparing a prospective film useful to a magneto-optical recording material.

However, the material for MO systems is TbFeCo or TbFeNiCo different from PCE material, TeGeSb because the MO disk drive requires a complicated system for applying the writing magnetic field with a polarity opposite to the erasing magnetic field while the PCE disk drive requires a simple system for applying the laser with a modulated intensity between a recording one and an erasing one.

Therefore, with a PCE disk, the overwrite mechanism is easy to design and reversibility is fair compared to the MO disk, so that the present invention is to provide a PCE disk with the superior overwrite system.

The overwrite system in the PCE disk is as follows. The laser intensity is modulated between a recording intensity and an erasing intensity. When the intensity is a recording level, the material having a recording signal reaches a melting temperature and then is quenched rapidly to be in the amorphous phases, giving low surface reflectivity in which a new signal is directly overwritten on the old signal and recorded. On the other hand, when the intensity is an erasing level, the material is heated up to more than the crystallization point, allowing rapid crystallization to proceed, giving an increased surface reflectivity, so that the old signal is erased. As seen from this, the crystallization velocity of the disk material is a very important parameter for carrying out the overwrite method. If the crystallization velocity is too slow (i.e. the crystallization time is too long) compared with the irradiation time of the laser, the material can not be sufficiently crystallized to have no-erased part. Contrary to this, if the crystallization velocity is too fast (i.e. the crystallization time is too short) compared with the irradiation time of the laser, the material is recrystallized and can not be sufficiently changed to an amorphous phase even if heated to be melt, resulting in insufficient recording state or distorted recording style. Accordingly, the linear velocity (the relative velocity of the optical disk against the laser irradiation) should be chosen to correspond with the inherent crystallization velocity of the disk material.

As the material of the PCE disk there has been known GeSbTe ternary alloy, which thin film has a changeable crystallization velocity as shown in FIG. 3 reported in Japanese Journal of Applied Physics, Vol.26 (1987) Supplement 26-4, page 61. According to FIG. 3, the crystallization velocity can be changed along the line connecting between the GeTe point and the $Sb_2Te_3$ point thereof. Seen from FIG. 3, richer GeTe the alloy contains, slower the crystallization velocity becomes. On the other hand, richer $Sb_2Te_3$ the alloy contains, faster the crystallization velocity becomes.

Therefore, on the basis of the above theory, there has been proposed a method for controlling the crystallization velocity of the PCE disk in Japanese Patent Tokuganhei 1-184510, wherein the disk has a characteristic that the crystallization velocity is designed by means of adjusting the compositional ratio of GeTe and $Sb_2Te_3$.

However, after our further investigation there has been found problems that the above manner of changing the crystallization velocity in the radical direction of the disk makes amplitudes of the regenerative signal different with the crystallization velocity, which results in obtaining no homogeneous regenerative quality on all the recording area of the optical disk. The reason is that the compositional ratio between GeTe and $Sb_2Te_3$ changes not only the crystallization velocity of the recording film as shown above but also the complex index of refraction so much, which causes change of reflectance in the crystallization phase and the amorphous phase, resulting in change of amplitude of the regenerative signal, because the signal regeneration in the phase change optical disk system is carried out by detecting the difference of reflectance between the crystallization phase and the amorphous phase on irradiation of the laser.

A first object of the present invention is to provide a method for manufacturing the PCE optical under control of not only the crystallization velocity but also the complex index of refraction and thus the reflectance on the disk surface.

Meanwhile, there are two manners of rotating the optical disk for write/read; one is to keep the constant linear velocity at all the area of the disk during operation. The other is to keep the constant angular velocity (the constant rotational numbers) during operation. According to the latter method, a higher operation can be done because of no adjustment required even if the optical head moves from inside area to outside area of the disk in order to make access to necessary informations. Therefore, the latter method is recommendable. However, if the optical disk rotates at the constant angular velocity, the linear velocity changes between the inside area and the outside area. That is, it runs slower at the inside area and faster at the outside area. In such case, if the disk has the crystallization velocity corresponding to the inside linear velocity, non-erased part remains due to short of crystallization. On the other hand, if the disk has the crystallization velocity corresponding to the outside area, recrystallization of the melt part proceeds at the inside area and insufficient recording mark might be obtained.

To solve the problem, according to Japanese Patent Tokuganhei 1-184510, it is proposed that the recording film composition should be changed to adjust the crystallization velocity in the radial direction with richer GeTe content in the inside area and richer Sb2Te3 content in the outside area, resulting in good erasing characteristics from at all the area of the disk. As explained the above, however, the crystallization velocity in the radical direction of the disk makes amplitudes of the regenerative signal different with the crystallization velocity, which results in obtaining no homogeneous regenerative quality on all the recording area of the optical disk.

Therefore, a second object of the present invention is to provide a PCE optical disk suitable to be used under the constant angular velocity (the constant rotational numbers wherein the disk has a characteristic that the crystallization velocity is designed to become faster from inside area of the disk to outside area in the radical direction thereof under control of not only the crystallization velocity but also the complex index of refraction and thus the reflectance on the disk surface.

Further, according to the Japanese Patent Tokuganhei 1-184510, in order that the crystallization velocity is increased in a radial direction from inside area to outside area in the disk by means of sputtering from at least two targets at the same time, more than two evaporating or sputtering source are arranged at positions offset from the rotational center of the disk, so that higher rotation of the disk or slower formation rate of the disk must be adopted in order to make the disk to have a same composition in the circumferential direction of the disk. This is a big problem to be solved in a case of mass production and high film formation to be required.

Therefore, in the case of mass production and high film formation to be required, a third object of the present invention is to provide an effective method for manufacturing the optical disk by means of sputtering from at least two targets at the same time in a manner that the crystallization velocity is increased in a radial direction from inside area to outside area in the disk.

SUMMARY OF THE INVENTION

According to our inventors' investigation, it has been found that in GeTeSb ternary alloy, the Sb content effects the crystallization velocity without changing the complex index of refraction and thus the reflectance as long as the Sb content is changed along the line connecting between a desired point on the line between A (GeTe) and B (Sb2Te3) and the Sb100% point. Therefore, according to a first aspect of the present invention, there is provided a method for preparing an optical information recording disk comprising depositing a recording film on a substrate, which recording film consists essentially of a material which is reversibly phase changeable between an amorphous phase and a crystal phase upon irradiation with a laser beam wherein the phase changeable recording films Ge, Te and Sb and is deposited by means of sputtering from at least two targets at the same time, the targets each comprising a ternary alloy of Ge, Te and Sb with a different crystallization velocity to the recording film from that which occurs if deposition is carried out by a single target, said targets each having a ternary alloy composition on a line extending through an optional point on the A-B line connecting GeTe and Sb2Te3 from the Sb 100% point, but not including the 100% point, in the ternary system diagram of FIG. 1.

In a preferred embodiment, one of the targets has a composition located on a cross point between the line connecting Ge50Te50 and Sb40Te60 and the line connecting the desired compositional ratio point and the Sb 100% point in the ternary system diagram of FIG. 1. Further, it is preferable that the sputtering is carried out in an atmosphere containing nitrogen gas in order to make the recording film further comprise N atoms.

In carrying out the present invention, the power for each sputtering applied to the targets may be substantially the same during the sputtering process.

According to the above method of the present invention, there is provided an optical information recording disk comprising a recording film deposited on a substrate, which recording film consists essentially of a material which is reversibly phase changeable between an amorphous phase and a crystal phase upon irradiation with a laser beam wherein the phase changeable recording films comprises three alloy components Ge, Te and Sb which atom % ratios in an area of ternary system diagram of FIG. 8 enclosed by the following four points;

A:(Ge,Sb,Te)=(50,0,50)
B:(Ge,Sb,Te)=(0,40,60)
C:(Ge,Sb,Te)=(0,55,45)
D:(Ge,Sb,Te)=(45,10,45)

While the crystallization velocity can be changed in a Te richer region beyond the line A-B of FIG. 8 which is the line connecting Ge50Te50 point and Sb40Te60 point, it is found that the quality of signal is lowered with repeat recording of the signal.

On the other hand, it is found that the crystallization becomes longer than 1 $\mu$s in a Ge richer region beyond the D-A line which is on the line connecting Ge50Te50 point and Sb100 point. The time 1 $\mu$s means a required time during which a laser spot having a diameter of 1 $\mu$m passes through a point of the optical disk at a linear speed of 1 m/s. Generally speaking, the optical disk is operated at a linear speed of more than 1 $\mu$s, so that the longer crystallization velocity is not practical as the recording material of the optical disk. Further, the longer material can not be used as the optical recording films because of large recording power necessary to make the material belonging to the region to be melt.

Furthermore, it is found that the crystallization velocity in a region of the poorer Te below the C-D line is longer than 1 $\mu$s and not practical, so that it is better to contains Te of more than 45%.

Especially, in case of the composition on the G-M line wherein the compositional atom % ratio of Ge and Te is about 2:5, it is found that a very good overwrite characteristic can be obtained and the overwrite number of more than 1,000,000 can be realized.

In this invention, although the phase changeable recording films essentially consists of three alloy components Ge, Te and Sb, the other component or components may be added as long as it spoil the feature of the invention. In the case of the ternary alloy composition of Ge, Te and Sb, the Sb content may be decreased in a radial direction from inside area to outside area in the disk to change the crystallization velocity if the disk is used at the constant angular velocity. On the other hand, in the case of the ternary alloy composition including further at least one additional component, especially selected from the groups comprising Pd, Co, Ni, Ti, Se, In, Au, Ag and Cr, the additional component content should be decreased in a radial direction from inside area to outside area in the disk. In the latter case, the additional component content is preferably 20 atom % or less. If it is over 20 atom %, the crystallization velocity might suddenly drop down and the complex index of reflection might change very much.

According to a second aspect of the present invention, there is provided an optical information recording disk comprising a recording film deposited on a substrate, which recording film consists essentially of a material which is reversibly phase changeable between an amorphous phase and a crystal phase upon irradiation with a laser beam wherein the phase changeable recording films comprises at least three alloy components Ge, Te and Sb which at % ratios in an area of ternary system diagram of FIG. 8 enclosed by the following four points;

A: (Ge,Sb,Te)=(50,0,50)
B:(Ge,Sb,Te)=(0,40,60)
C:(Ge,Sb,Te)=(0,55,45)
D:(Ge,Sb,Te)=(45,10,45)

and wherein the compositional at. % ratio of Te and GE is about constant, and wherein the Sb content is decreased in a radical direction from inside area to outside area in the disk.

Furthermore, according to a third aspect of the present invention, there is provided a method for preparing an optical information recording disk comprising depositing a recording film on a substrate, which recording film consists essentially of a material which is reversibly phase changeable between an amorphous phase and a crystal phase upon irradiation with a laser beam wherein the phase changeable recording films is deposited by means of sputtering from at least two targets at the same time in a manner that the crystallization velocity is increased in a radial direction from inside area to outside area in the disk, the targets each comprising different components or different compositon, said targets comprising a combination of an outside ring one having a center hole and at least one inside ring or disc positioned substantially concentrically within the center hole and being arranged substantially concentrically opposite to the substrate.

In a preferred embodiment, the diameter of the center hole of the outside ring target is equal to the diameter of the inside ring or disc target.

In carrying out the method for preparing an optical information recording disk, it is preferable that each targets having a ternary alloy composition of Ge, Te and Sb on a line extending through an optional point on the A-B line connecting Ge50Te50 and Sb40Te60 from the Sb 100% point, but not including the 100% point, in the ternary system diagram of FIG. 1 wherein the outside target contains Sb less than the inside target. Especially, it is recommended that each targets has the compositional atom % ratio of Ge and Te is about 2:5.

In the case of each targets comprising three alloy components Ge, Te and Sb and further at least one additional component selected from the groups comprising Pd, Co, Ni, Ti, Se, In, Au, Ag and Cr, the outside target contains the additional component less than the inside target in order to make the disk to have an increased crystallization velocity from the inside area to the outside area in a radial direction.

In a preferred embodiment of sputtering for preparing an optical information recording disk, the substrate may be at a standstill and opposite to the targets during sputtering.

In carrying out the method for preparing an optical information recording disk according to the invention, it is preferred that each targets has a different thickness.

DETAILED DESCRIPTION OF THE INVENTION

Figure 9:
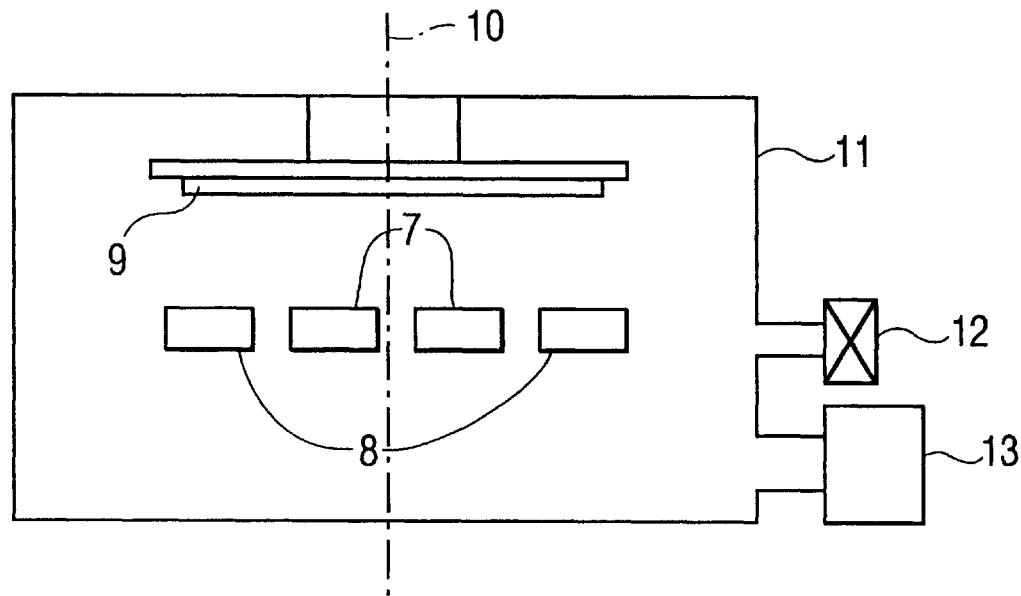
FIG. 9 is a view of the apparatus used for carrying out the method according to the present invention.
Figure 10:
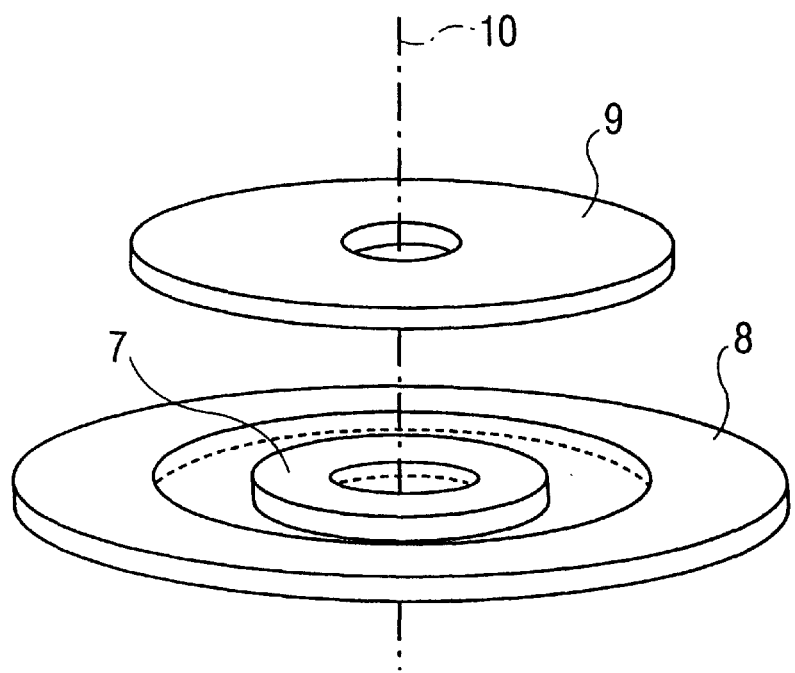
FIG. 10 is a perspective view showing a positional relation between a substrate and targets in an apparatus used in the present invention.
Figure 11:
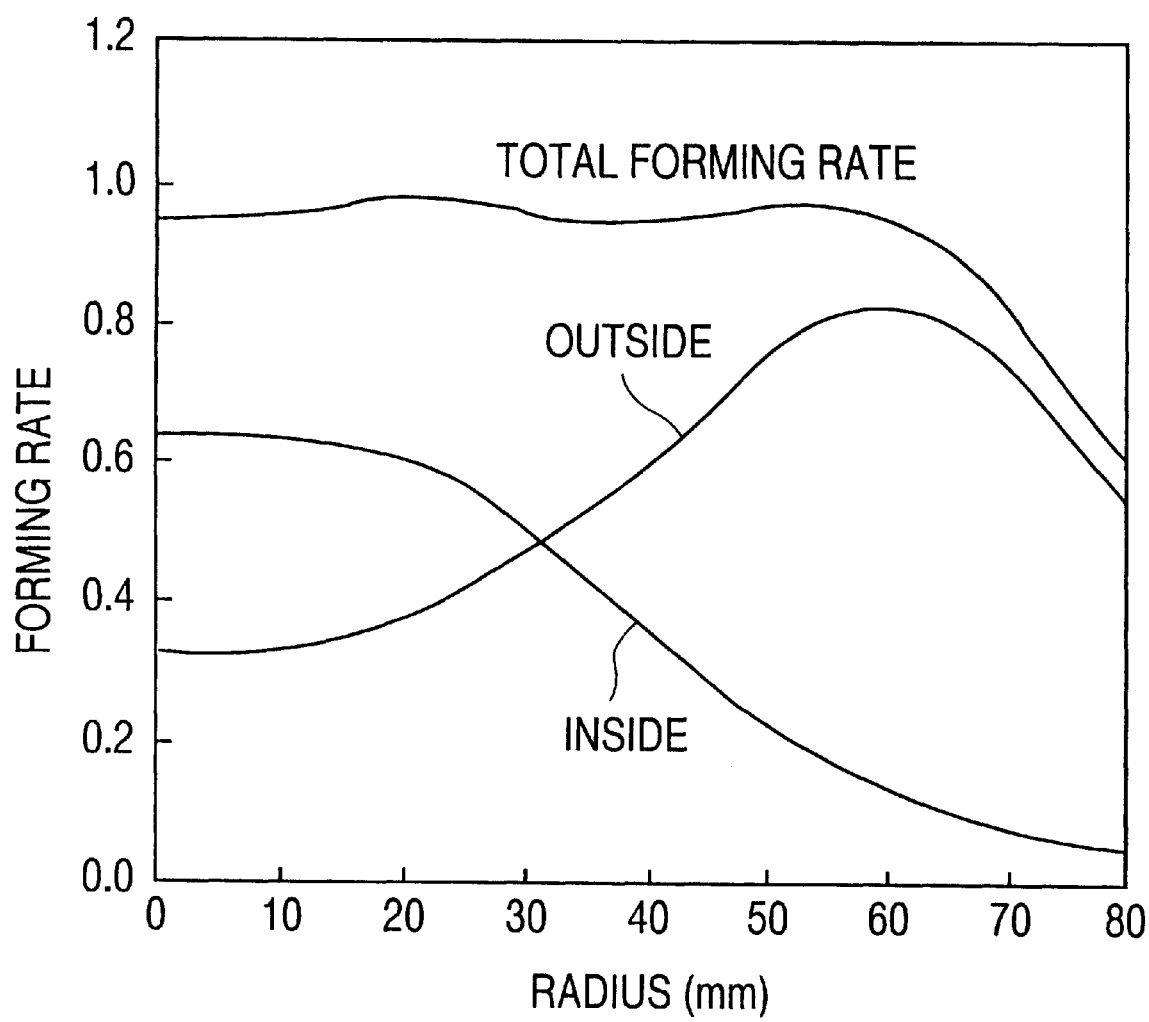
FIG. 11 is a graph showing the distribution of forming rates in case of using the sputtering apparatus of FIG. 4.

The method can be carried out by an apparatus shown in FIG. 9, in which a target arrangement, as shown in FIG. 10, comprises combination of an inside ring target 7 and an outside ring target 8 having a center hole receiving the inside ring target 7. The inside and outside ring targets are opposite to a substrate 9 and have a common center axis 10 which is also common with the substrate 9. In such a case, if the two targets have a different composition from each other, there can be manufactured an optical information recording disk which component changes from inside area to outside area. FIG. 11 shows a total film forming rate change in the radial direction of the substrate comprising a rate from the inside target and a rate from the outside target wherein the forming rate is standardized by the maximum value of total rates. Seen from this, a thickness of the recording film can be formed substantially uniformly by adjusting the inside rate and the outside rate.

Figure 12:
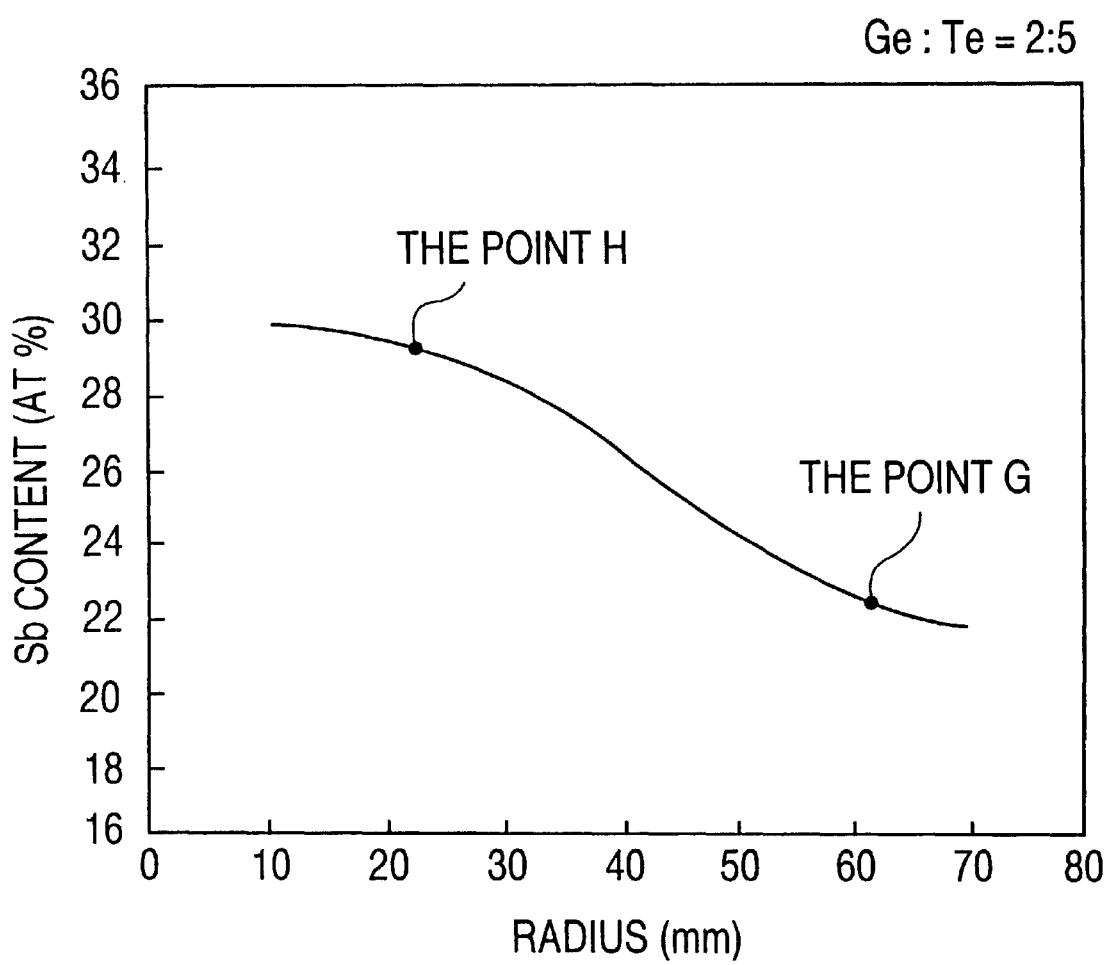
FIG. 12 is a graph showing a compositional distribution in the radial direction of the PCE optical recording disk formed by the apparatus of FIG. 4.

In the case of varying the composition of the recording film from the point H to the point G in the radial direction of the disk, as the inside target a composition of Sb richer point J than the point H and as the outside target a composition of Sb poorer point I than the point G are chosen. Sputtering by the targets makes the radial distribution of the recording film as shown in FIG. 12. Each compositional points I, G, H and J is on the line wherein the content ratio between Ge and Te is 2:5 and the Sb content changes, so that the recording film compositions in FIG. 12 are indicated representatively by the Sb content. In the case of recording region having a diameter of 25 mm at the most inside and 60 mm at the most outside in the optical disk, it can be seen that the most inside composition is around the H point and the most outside one is around the G point while the Sb content is decreased from the inside area to the outside area.

Depending on the target shape, TS distance (the distance between the target and the substrate), the substrate size and so on, the relation between the recording film composition and the target composition changes. In order to make the recording film composition to be in a scope enclosed by the four points A, B, C and D of FIG. 6 and have the same compositional ratio between Ge and Te at all the region of the optical disk while the Sb content is decreased from the inside area to the outside area in the disk, the ring target should have a composition in which the compositional ratio between Ge and Te is almost the same and the Ge content is larger than the Te content while the Sb content is decreased from the inside target to the outside target. However, the target composition is sometimes out of the scope enclosed by the four points A, B, C and D of FIG. 6.

In the above Example, two targets are used. More than three targets may be used. In such a case, the middle target or targets had better have a composition between those of the inside and the outside targets, which results in the recording film having a successively increased crystallization velocity from the inside area to the outside area.

In the case of increased number of ring targets, even if the substrate becomes larger, uniform film thickness can be obtained without making the TS distance too long, resulting in high deposition rate of sputtered atoms on the substrate. Therefore, the target material can be used effectively.

Figure 13:
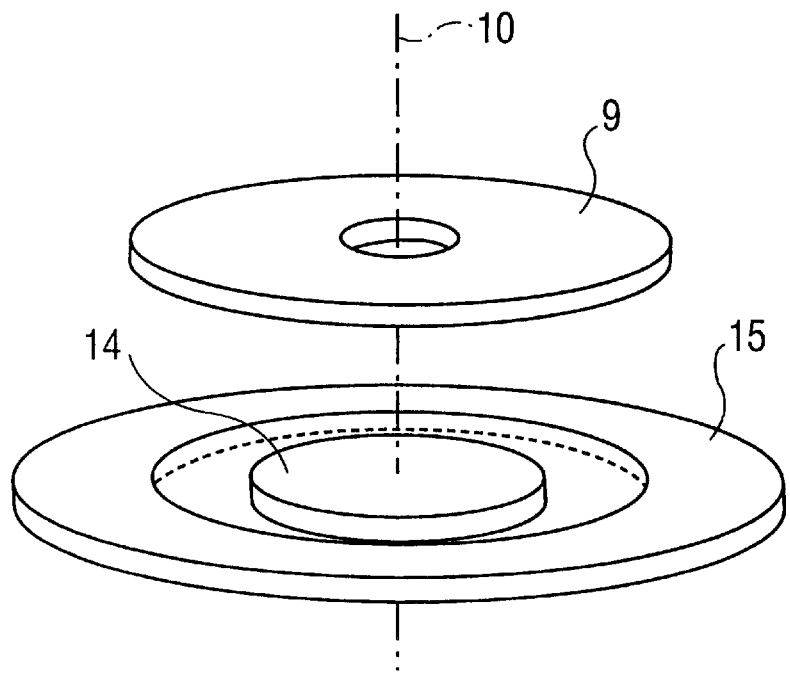
FIG. 13 is a perspective view showing a positional relation between a substrate and targets in a second apparatus used in the present invention.

While the targets in FIG. 10 are a ring shape, the inside target may be a disc 14 as shown in FIG. 13. In such cases, the target composition may be chosen the same as the above ring case. The number of the ring targets may be more than 2. Increased target number makes film thickness uniform without making the TS distance too long, and sputtered atoms come to have high deposition rate on the substrate. Therefore, the target material can be used effectively.

Figure 14:
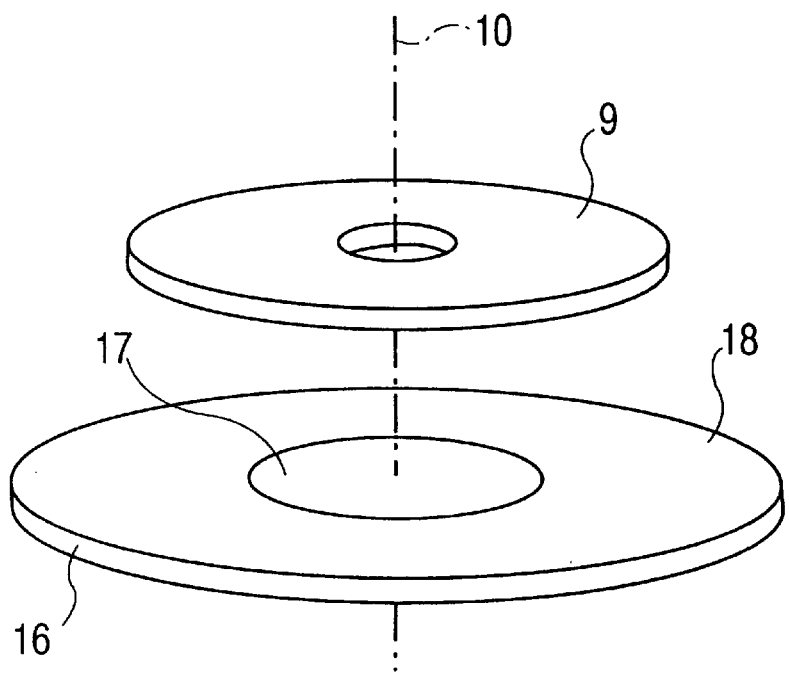
FIG. 14 is a perspective view showing a positional relation between a substrate and targets in a third apparatus used in the present invention.

Further, the targets may be a one body disc 16 as shown in FIG. 14 wherein the disk is concentrically divided into an inside area 17 and an outside area 18 which have a different composition from each other, so that the resulting disk has an increased crystallization velocity from the inside area to the outside area. In this case, it is advantageous that a conventional sputtering apparatus using a disc target can be used. That is, a simple apparatus can be used in order to make the optical disk having an increased crystallization velocity from the inside area to the outside area. While the target can be concentrically divided into more than 2 parts, 2 division type is better considering manufacture of the target. The target composition may be the same as the above ring case.

On the other hand, the targets in FIGS. 10 and 13 is easy to make. That is, one body target has a boundary between the inside area and the outside area. If the boundary has a gap or the like, it causes generation of abnormal discharge. Therefore, one body type target need high manufacturing technic. Contrary to this, the targets in FIGS. 10 and 13 have single composition, which does not cause such abnormal discharge.

Furthermore, in the case of adding the other component to the GeSbTe alloy target, it can be done by adding the other component more to the inside target. In the case of FIG. 10, the additional content of the inside target 7 may be made larger than that of the outside target 8. In the case of FIG. 13, the additional content of the disc target 14 may be made larger than that of the ring target 15. In the case of FIG. 14, the additional content of the inside area 17 may be made larger than that of the outside area 18. Thereby, it is possible to make the optical disk having the increased crystallization velocity from the inside area to the outside area.

The substrate may be rotated above the targets during film formation process. However, the target is a rotation symmetry one in relation to the center axis and the substrate has a common center axis with the targets so that the composition and the thickness on the substrate is isotropic against the center. Accordingly, the substrate may be in standstill opposite to the targets, which makes the sputtering apparatus construction simple because of no rotational mechanism.

In the case of using independent targets as shown FIGS. 10 and 13, it is desirable to make the life of targets same because exchange of the targets can be set to the same time and thus the apparatus stop time can be shorten, resulting in increased working time of the apparatus.

The required film forming speed from the target is different depending on a substrate shape, TS distance, target shape and so on. In order to make all the target life (the film forming ability) the same, each the target thickness had better is adjusted depending on the own film forming speed.

Figure 15:
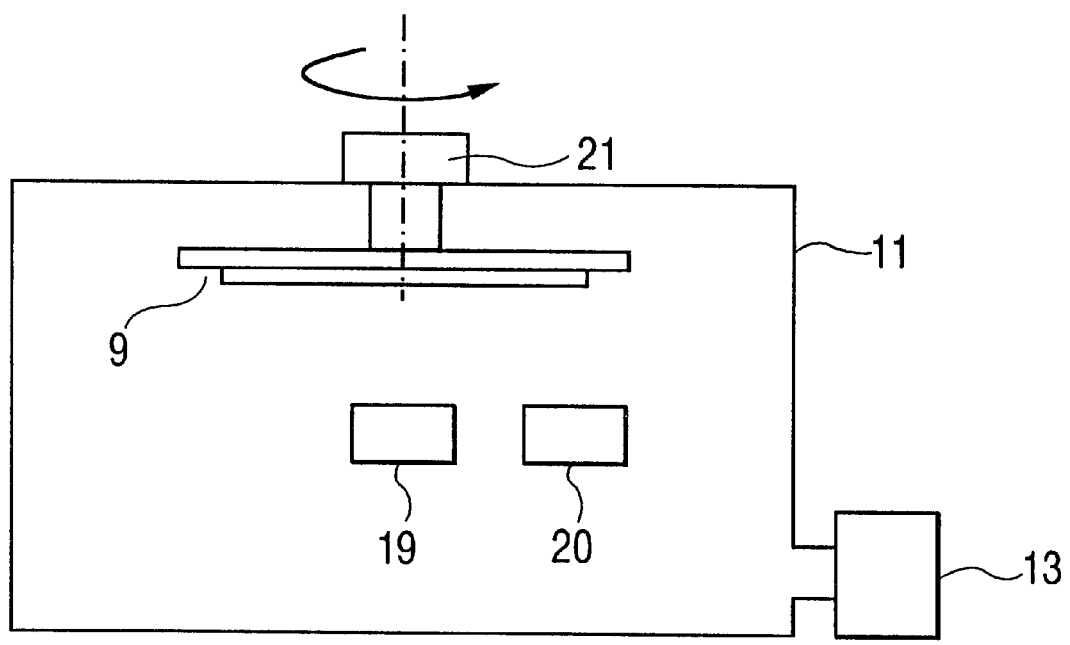
FIG. 15 is a schematic view showing an apparatus for vapor deposition at same time according to the present invention.

The film forming can be done by a multi vacuum deposition method wherein deposition sources and substrate are arranged as shown in FIG. 15. In such a case,if the center source 19 is made from the composition of the point J in FIG. 8 and the offset source 20 is made from the composition of the point I and further the same deposition process is carried out, there can be obtained the optical disk provided with the crystallization velocity decreased from the inside area to the outside area.

Compared with the sputtering method, however, there are problems such that deposition strength of the thin film formed by the vacuum deposition is small and foreign matter is easy to form on the substrate because of bubbling or the like on the source during formation process. Further, as the deposition generally generates from a point of the source, rotation of the substrate is required in order to make the composition and the thickness of the film to be isotropic to the center thereof. Especially, rapid formation in mass production needs high rotation of the substrate. It is not practical. Furthermore, if the materials to be deposited is an alloy containing many kinds of elements, compositional ratio of the formed film is different from the compositional ratio of the source and sometimes changes with time, so it is not practical.

EXAMPLE 1

Figure 2:
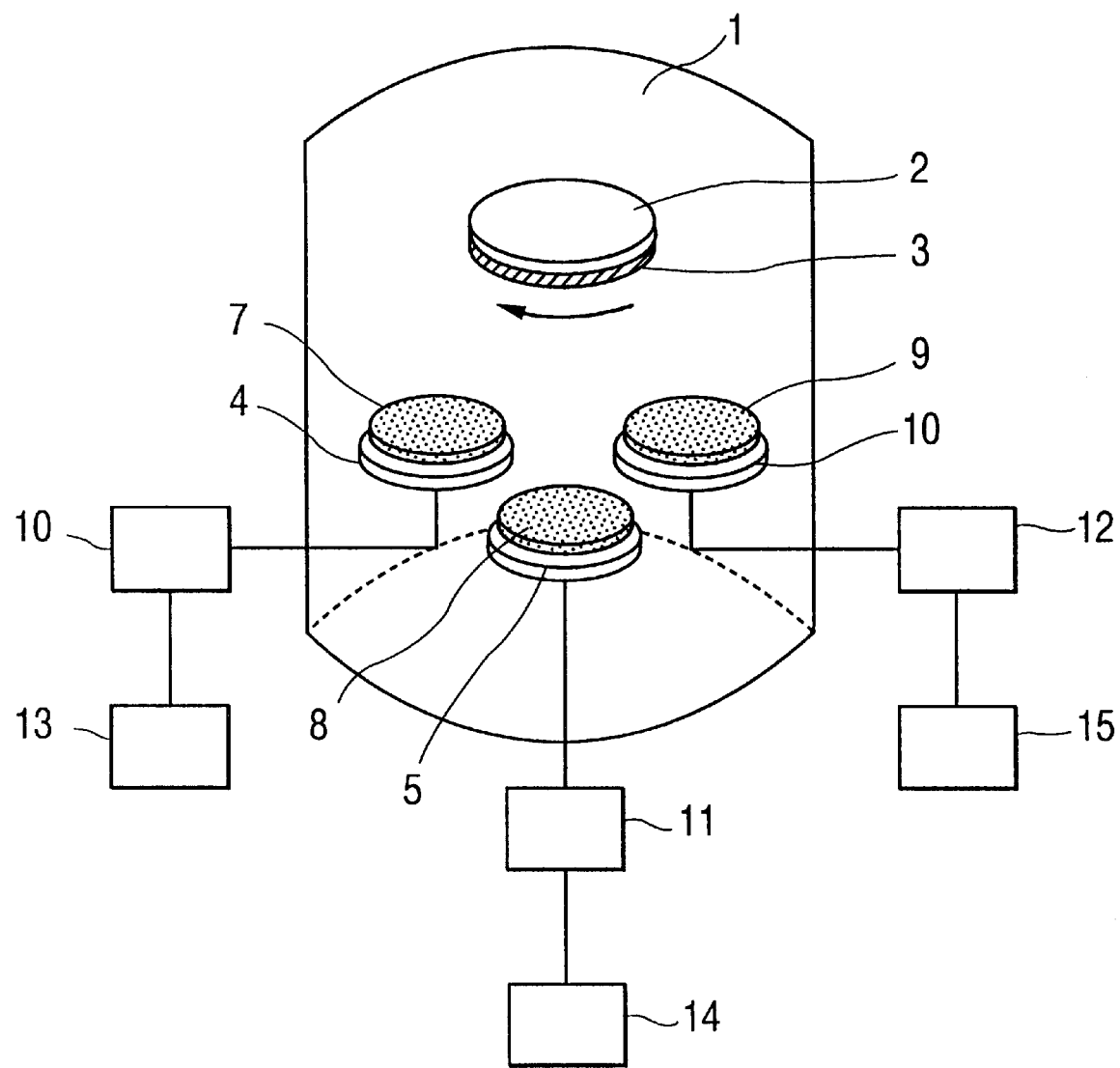
FIG. 2 is an example showing the positions of a substrate and targets of a sputtering apparatus employed in the present invention.

FIG. 2 is a schematic view of the embodiment according to the present invention showing the positions of three targets and a substrate. Numeral 1 denotes a sputtering chamber provided with a variety of control means, in which simultaneous sputtering from three targets (referred to as T1, T2, T3, respectively) can be carried out. A substrate 3 is supported and rotated at the upper side of the central position of three targets 7,8 and 9 mounted on each of target tables 4, 5 and 6. Each target is connected to a corresponding electric source 10, 11 or 12 and power controller 13, 14 or 15 to be applied with a power controlled independently according to a desired composition film. The diameter of all the targets is 100 mm. The distance from the central part of three targets to the substrate is 150 mm. A circular glass substrate having a diameter of 130 mm is used as the substrate. Sputtering is carried out by means of DC magnetron sputtering.

Figure 1:
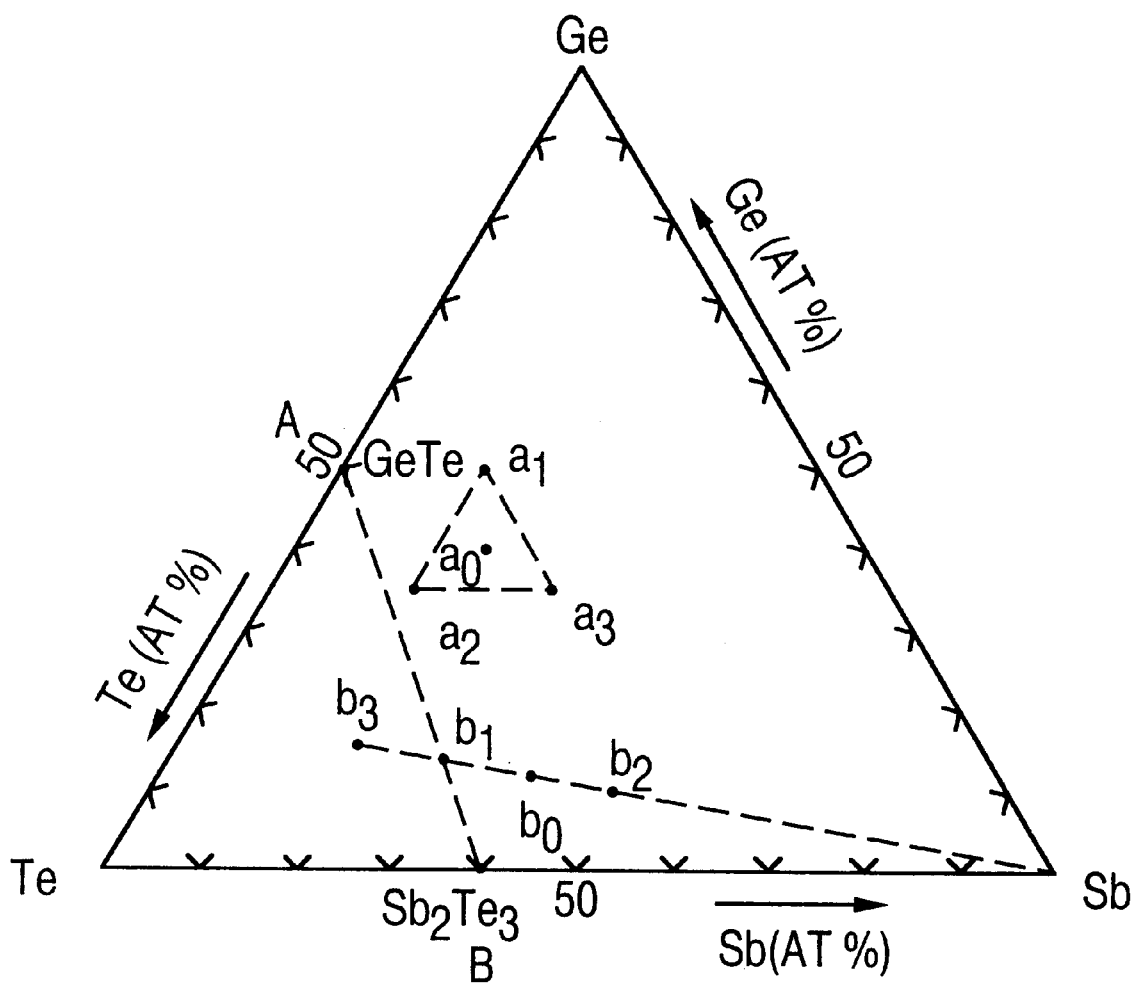
FIG. 1 shows relation between the target composition and the recording film composition in optical information recording materials prepared according to the present invention.

Experiments to form recording films of which composition is Ge40Sb20Te40 (atom %, hereafter referred to as $a_0$ composition) are conducted by means of the conventional method and the method according to the present invention. According to the conventional method, targets T1, T2 and T3 are made of the single elements, Ge, Sb and Te, respectively, and sputter power added to the targets is adjusted by means of three target simultaneous sputtering to control the recording-film composition. According to the method of the present invention, all the targets T1, T2 and T3 are composed of three elements, Ge, Sb and Te, and as shown in FIG. 1, the composition of each target is Ge50Sb15Te35 (T1, referred to as $a_1$ composition), Ge35Sb15Te50 (T2, referred to as $a_2$ composition), Ge35Sb30Te35 (T3, referred to as $a_3$ composition), respectively. The composition of T1, T2 and T3 is so selected that A composition is located at the center of gravity of the equilateral triangle formed by connecting T1, T2 and T3. Namely, when the compositional ratio of an arbitrary element in the recording film is $a_0$ and the compositional ratio of the arbitrary element in the targets is $a_1$, $a_2$ and $a_3$ respectively, then $a_0$ substantially satisfies $(a_1+a_2+a_3)/3$. Therefore substantially the same sputtering power should be applied to each target. Thus the sputter power added to each target is controlled by three target simultaneous sputtering to obtain the recording film of A composition. Upon sputtering, the pressure of argon (Ar) gas is kept constant at 5 mTorr. Tables 1 and 2 show relation between the sputter power applied to each target and each composition of the films obtained by the conventional method and by the method of the present invention, respectively. Each composition of the films is obtained by inductively coupled plasma spectrometry (ICP spectrometry).

As can be seen from Table 1, in the case of forming the recording film having A composition by means of the conventional method, when 100 W is added to T1, the power added to T2 and T3 is about 25 W and 40 W, respectively. Thus the power to be applied varies with the target. On the contrary, as can be seen from Table 2, according to the present invention, when 10 W is applied to T1, the power applied to T2 and T3 is about 86 W and 90 W, respectively.

Thus the power to be applied varies only a little with the target. The electric discharge generally becomes unstable as less power is applied. It is preferable therefore that upon simultaneous sputtering, the power applied to the targets do not vary with the target for the sake of the stable electric discharge in each target. It is understood then that the method of the present invention is superior to the conventional method.

It can also be understood from Tables 1 and 2 that upon changing the sputter power, the ratio of changing the recording-film composition is less in the present invention than in the conventional method. Namely, when the sputter power to T2 or T3 changes by 5 W, the ratio of maximum quantity of change of each element is Ge:2.2at %, Sb:4.0at %, Te:2.8at % in the conventional method, and Ge:0.1at %, Sb:0.3at %, Te:0.3at % in the present invention. Thus according to the present invention, even when the power change takes place, the effect, on the recording-film composition can be reduced. This fact also indicates that according to the present invention, the recording-film composition can be controlled accurately within the range close to the aimed composition by changing the sputter power.

In this example, the targets are composed of B, C and D composition, respectively, to obtain the recording film having A composition, but any other targets composed of different composition may also be used as long as the power applied to each target is substantially the same.

TABLE 1

| | sputter power (W) | | | recording-film composition (at %) | | |
|---|---|---|---|---|---|---|
| | T1 (Ge) | T2 (Sb) | T3 (Te) | Ge | Sb | Te |
| 1) | 100 | 25 | 40 | 40.1 | 20.5 | 39.4 |
| 2) | 100 | 20 | 40 | 42.0 | 16.5 | 41.5 |
| 3) | 100 | 25 | 35 | 42.3 | 21.1 | 36.6 |

TABLE 2

| | sputter power (W) | | | recording-film composition (at %) | | |
|---|---|---|---|---|---|---|
| | T1 (B) | T2 (C) | T3 (D) | Ge | Sb | Te |
| 4) | 100 | 86 | 90 | 40.2 | 19.8 | 40.0 |
| 5) | 100 | 81 | 90 | 40.3 | 20.0 | 39.7 |
| 6) | 100 | 86 | 85 | 40.3 | 19.5 | 40.2 |

Figure 3:
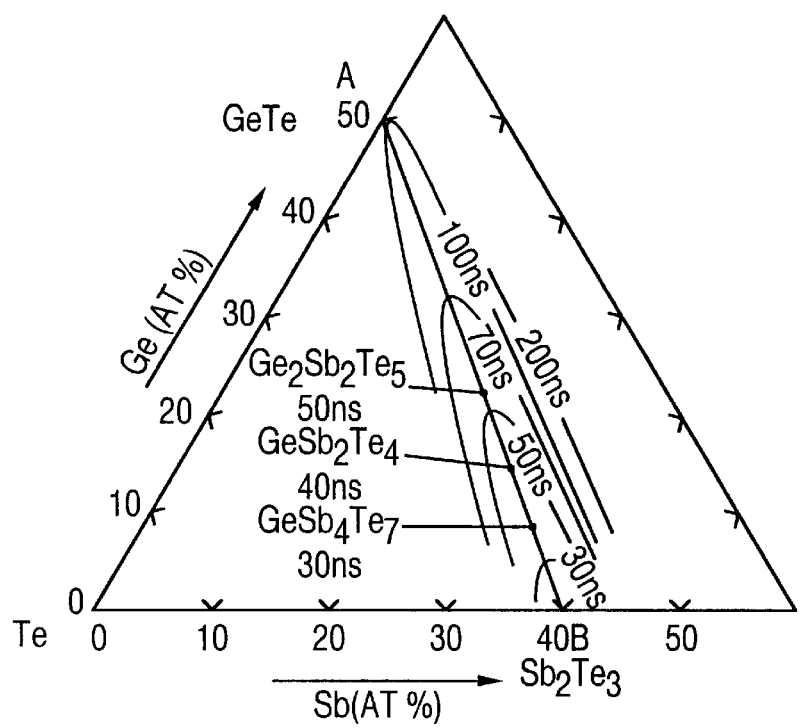
FIG. 3 shows compositional dependency of the crystallization velocity of PCE recording film of GeSbTe ternary system.
Figure 4:
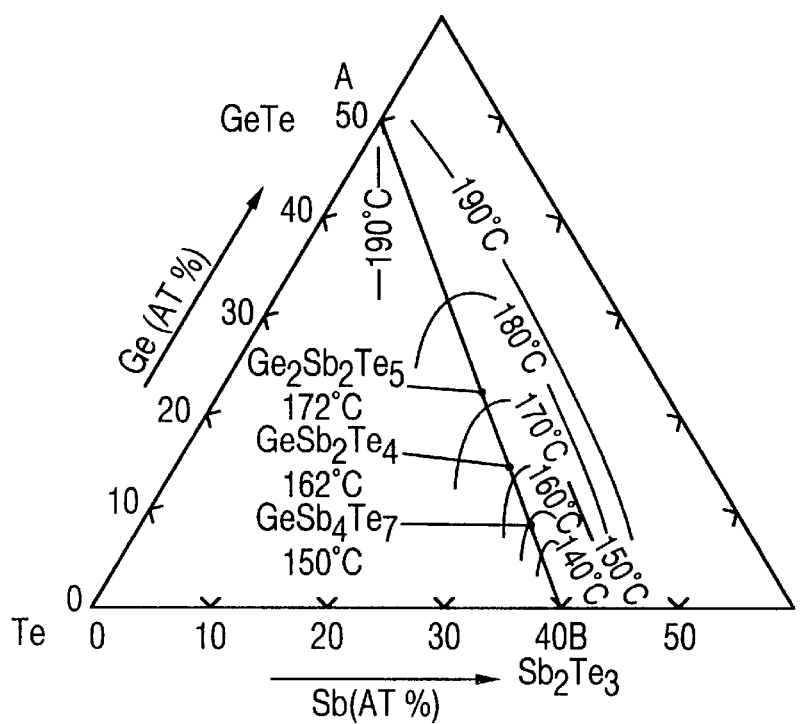
FIG. 4 shows compositional dependency of temperatures of crystallization of PCE recording film of GeSbTE ternary system.

The inventors have reported that in the ternary system of Ge, Sb and Te, the velocity of crystallization of the composition located on the line connecting GeTe and Sb2Te3, as shown in FIG. 3, is fast and the velocity of crystallization of the composition becomes slower as the composition is located farther away from the line, and further as shown in FIG. 4, the temperature of crystallization increases as the composition is located farther away from the line(Proc. Int. Symp. on. Optical. Memory, 1987 JJAP, Vol. 26(1987) Supplement 26-4). The velocity and the temperature of crystallization have a great influence on recording sensitivity, erasing sensitivity and conservation of recorded signals of optical disks. It is necessary therefore to accurately control the composition located away from this line so as to mass-produce the optical disks of this ternary system. For this purpose, in the conventional method, two target simultaneous sputtering from, for example, a target of the composition located on the line and from a target composed of the elementary substance of Sb may be carried out. For example, the recording-film composition of Ge12Sb39Te49 can be obtained by simultaneous sputtering from the Ge14Sb29Te57-target and from the Sb-target. However, according to this method, the sputter power applied to each target greatly varies; for example, when 100 W is applied to the Ge14Sb29Te57-target, then about 10 W is applied to the Sb-target. Namely, due to such a little power applied to the Sb-target, the electric discharge is apt to be unstable and fine control of the recording-film composition within the range close to Ge12Sb39Te49 is difficult. Now simultaneous sputtering using two targets of Ge14Sb29Te57 and Ge10Sb49Te41 according to the present invention is carried out. This example is explained in detail.

EXAMPLE 2

The same sputtering apparatus as used in Example 1 is used. Two target simultaneous sputtering is carried out to form a film from target T1 of Ge14Sb29Te57 ($b_1$ composition) and target T2 of Ge10Sb49Te41 ($b_2$ composition). $b_1$ composition and $b_2$ composition are so selected that in the compositional figure they are point symmetry with respect to the aimed recording-film composition of $b_0$ composition. Namely, the target composition is so selected that when the compositional ratio of an arbitrary element in the recording film is $b_0$ and the compositional ratio of the arbitrary element in the targets is $b_1$ and $b_2$, respectively, then $b_0$ substantially satisfies $(b_1+b_2)/2$. Therefore substantially the same sputtering power should be applied to each target. Thus the sputter power applied to each target is controlled by two target simultaneous sputtering to obtain the recording film of the composition Ge12Sb39Te49. Upon sputtering, the pressure of argon (Ar) gas is kept constant at 5 mTorr. Table 3 shows relation between the sputter power applied to each target and each composition of the films thus obtained.

As can be seen from Table 3, in the case of forming the recording film having E composition, when the power of 100 W is applied to T1, then about 94 W is applied to T2. Thus the power to be applied do not vary much with the target. Further from Table 3, it is understood that even when the putter-power change takes place, there is little effect on the recording-film composition. This fact also indicates that according to the present invention, the recording-film composition can be controlled accurately within the range close to the aimed composition by changing the sputter power.

TABLE 3

| sputter power (W) | | recording-film composition (at %) | | |
|---|---|---|---|---|
| T1 | T2 | Ge | Sb | Te |
| 7) 100 | 94 | 12.0 | 38.8 | 49.2 |
| 8) 100 | 89 | 12.2 | 37.5 | 50.3 |
| 9) 100 | 99 | 11.9 | 40.2 | 47.9 |

In this example, Ge14Sb29Te57 (composition) is selected as target T1, but instead of $b_1$ composition used as T1, for example, Ge16Sb19Te65 ($b_3$ composition) may be used then two way simultaneous sputtering may be carried out together with T2 of Ge10Sb49 Te41($b_2$ composition). The power ratio to be applied to each target is changed so as to form a film, accurately controlling the recording-film composition located adjacent to the line connecting $b_0$ and $b_1$. As can be seen from FIG. 3, the velocity of crystallization changes greatly in the vicinity of the line connecting $b_0$ and $b_1$, accordingly the velocity of crystallization can be freely and accurately controlled using only two targets of $b_2$ composition and $b_3$ composition. Generally the recording films with slow velocity of crystallization are used in the optical disks with the slow transfer rate and the recording films with fast velocity of crystallization are used in the optical disks with the fast transfer rate. The method of the present invention can cope with a variety of optical disks with different transfer rates, using only two targets.

Figure 5:
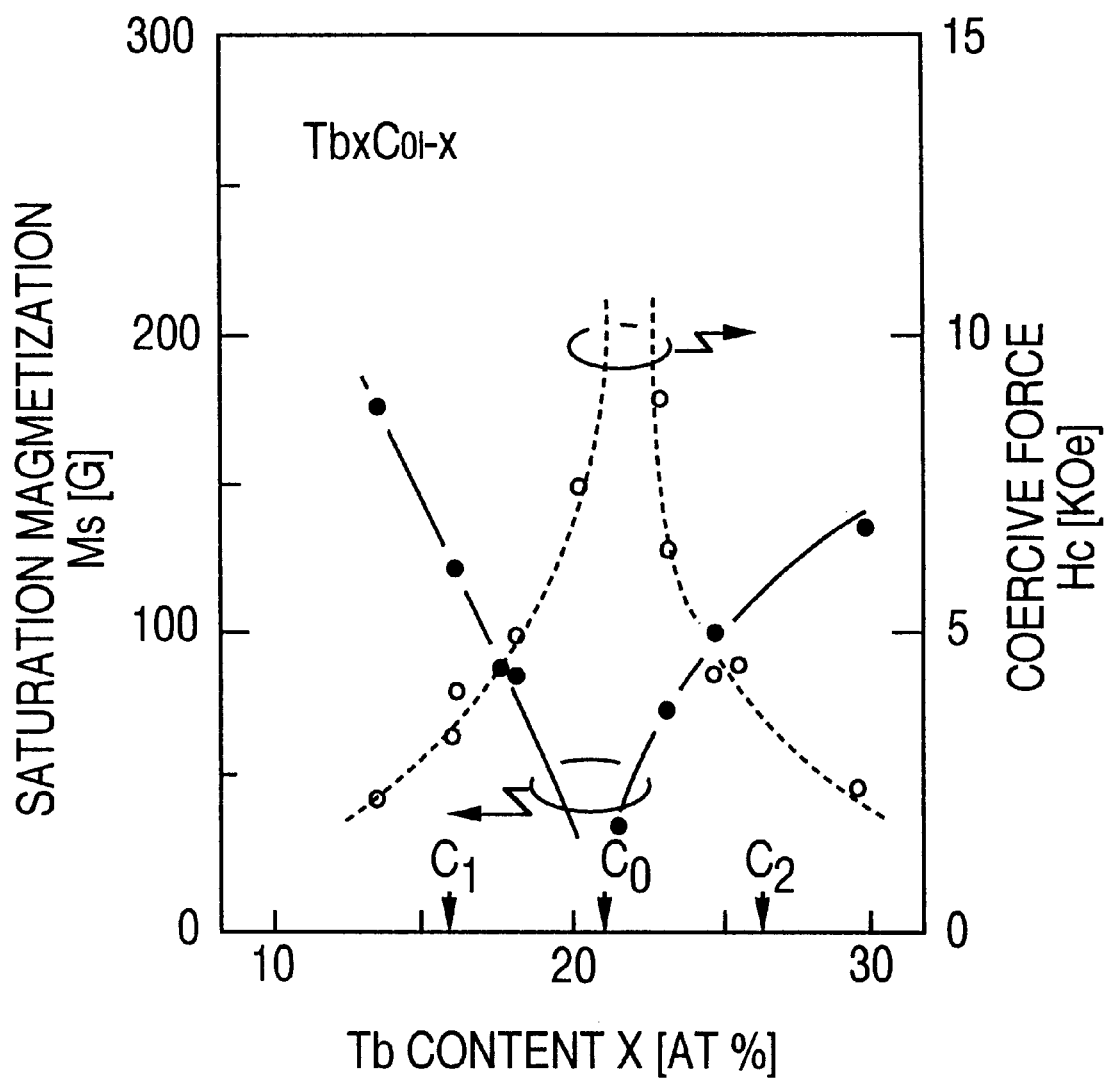
FIG. 5 shows compositional dependency of saturation magnetization and coercive force of TbCo system.

In the aforementioned examples 1 and 2, the recording films of the phase changing type are formed, but the present invention can also be effective to the production of the magneto-optical type of the recording films. For example, it is known that the coercive force and the saturation magnetization of a recording film comprising TbCo greatly vary with the quantity of Tb to be added, as shown in FIG. 5. It is therefore necessary to accurately control compositional ratio of each element in the case of forming such a recording film. The production method according to the present invention is very effective to such a case. For example, two targets of $c_1$ composition (Tb16Co84) and $c_2$ composition (Tb26Co74) are used to obtain a recording film of $c_0$ composition in FIG. 5, that is, Tb21Co79. The power to be applied to both targets can be set substantially constant and even when a sputter-power change takes place, the recording-film composition do not change much. Further accurate control of the recording-film composition within the range close to the aimed composition can be carried out by changing the sputter power.

The production method according to the present invention as explained in the aforementioned example can also be applied to reaction sputtering. Reaction sputtering is carried out in such a manner that gas which contains elements composing the constituents of a recording film is added in sputter gas to derive reactions of the elements on elements contained in targets so as to take in the elements contained in the gas in the recording film. Therefore, although a number of elements contained in the targets and a number of elements contained in the recording film are different, the compositional ratio of elements supplied from the targets can be controlled accurately.

EXAMPLE 3

In this example, nitrogen (N2) gas at 0.5 mTorr is added to argon (Ar) gas at 5 mTorr to a recording film. Then the composition of the recording film thus obtained is quantitatively analyzed by X-ray photo-electron spectroscopy (XPS). The results is shown in Table 4. Although nitrogen is contained unlike in Example 2, the ratio of three elements, Ge, Sb and Te is almost the same as sample 7). This fact indicates that the production method of the present invention is effective to this case.

TABLE 4

| sputter power (W) | | recording-film composition (at %) | | | |
|---|---|---|---|---|---|
| T1 | T2 | Ge | Sb | Te | N |
| 10) 100 | 94 | 11.3 | 36.8 | 46.8 | 5.1 |

According to the production method of optical information-recording materials of the present invention, the elements composing the targets are the same and the compositional ratio of the elements is substantially the same, by which substantially the same sputter rate can be set and substantially the same power can be applied to each target upon simultaneous sputtering. Accordingly films can be formed under the stable sputter conditions.

Further even when the power applied to each target changes, the recording-film composition do not change much due to the the compositional ratio of the targets, close to each other. In other words, fine control of the recording-film composition can be carried out only by changing power applied to each target.

Since the recording-film composition can be changed continuously only by changing power applied to each target, recording mediums with different properties can be produced by the same targets.

EXAMPLE 4

The relation between the recording film composition and the reflectance of the optical disk is investigated.

Figure 7:
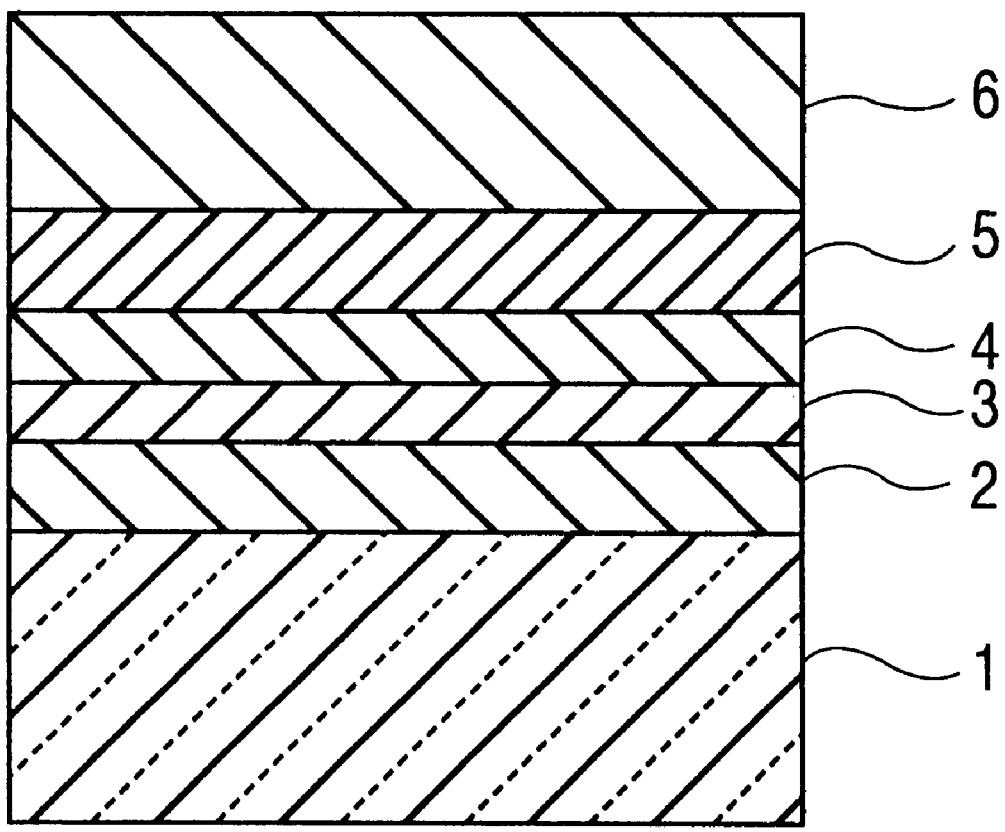
FIG. 7 shows a sectional structure of the PCE optical recording disk according to the present invention.

The reflectance of the optical disk is measured by method comprising the steps, forming a film on a glass plate in a same construction as FIG. 7, measuring the reflectance Ra of amorphous state just after forming and the reflectance Rc of the crystal state after heat treatment for 5 minutes at 300° C. and calculating the difference ΔR=Rc—Ra.

In FIG. 7, a first dielectric layer 2 and a second dielectric layer 4 are made from ZnS containing 20 mol % of SiO2. The reflective layer is made of Al. The first dielectric layer 2 has a thickness of 174 nm, a recording film 3 a thickness of 30 nm, the second dielectric layer 4 a thickness of 23 nm, the reflective layer 5 a thickness of 100 nm. The measuring wave length is 730 nm.

Figure 16:
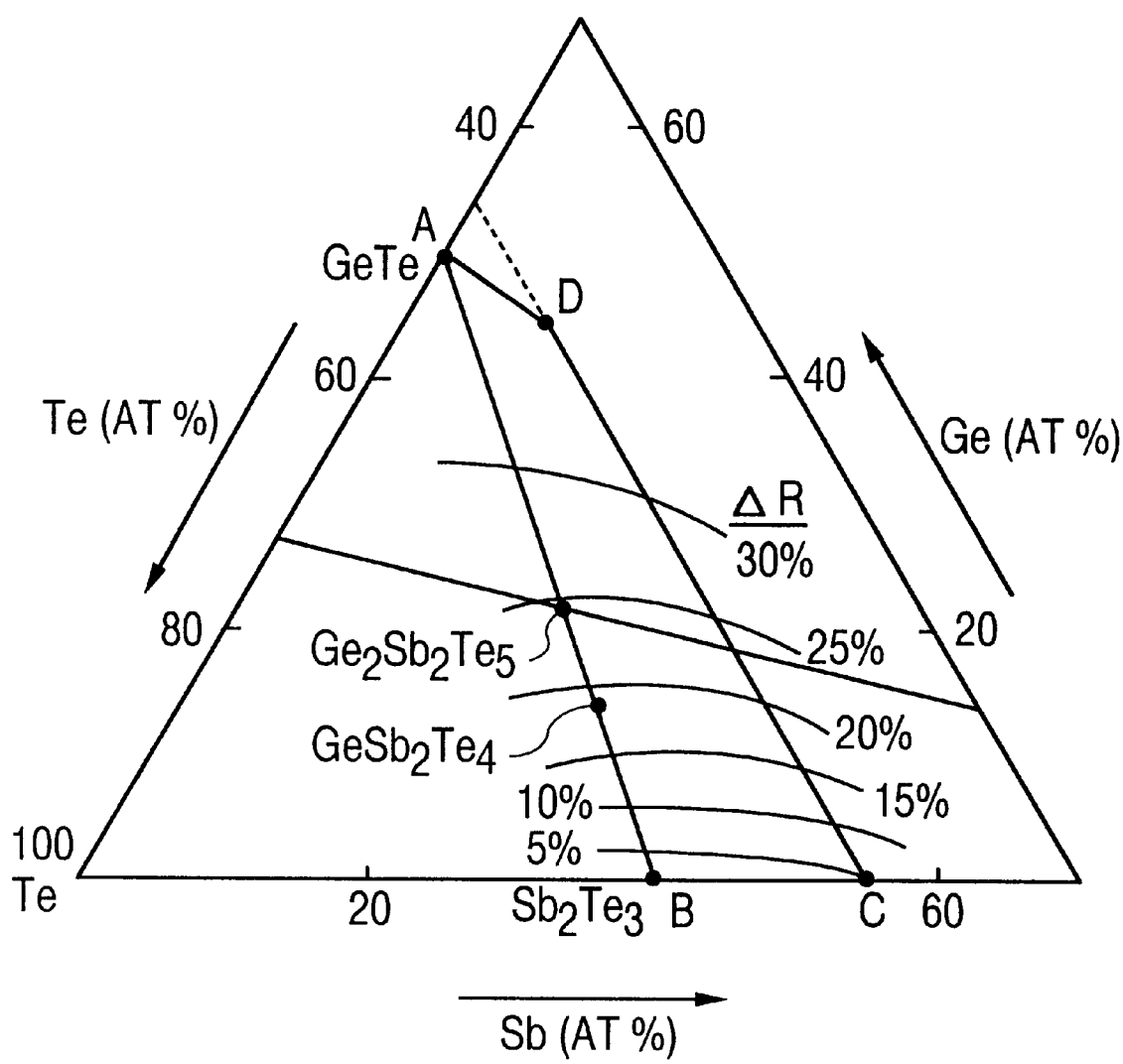
FIG. 16 is a graph showing a relation between reflectance change ΔR and the recording film composition.
Figure 17:
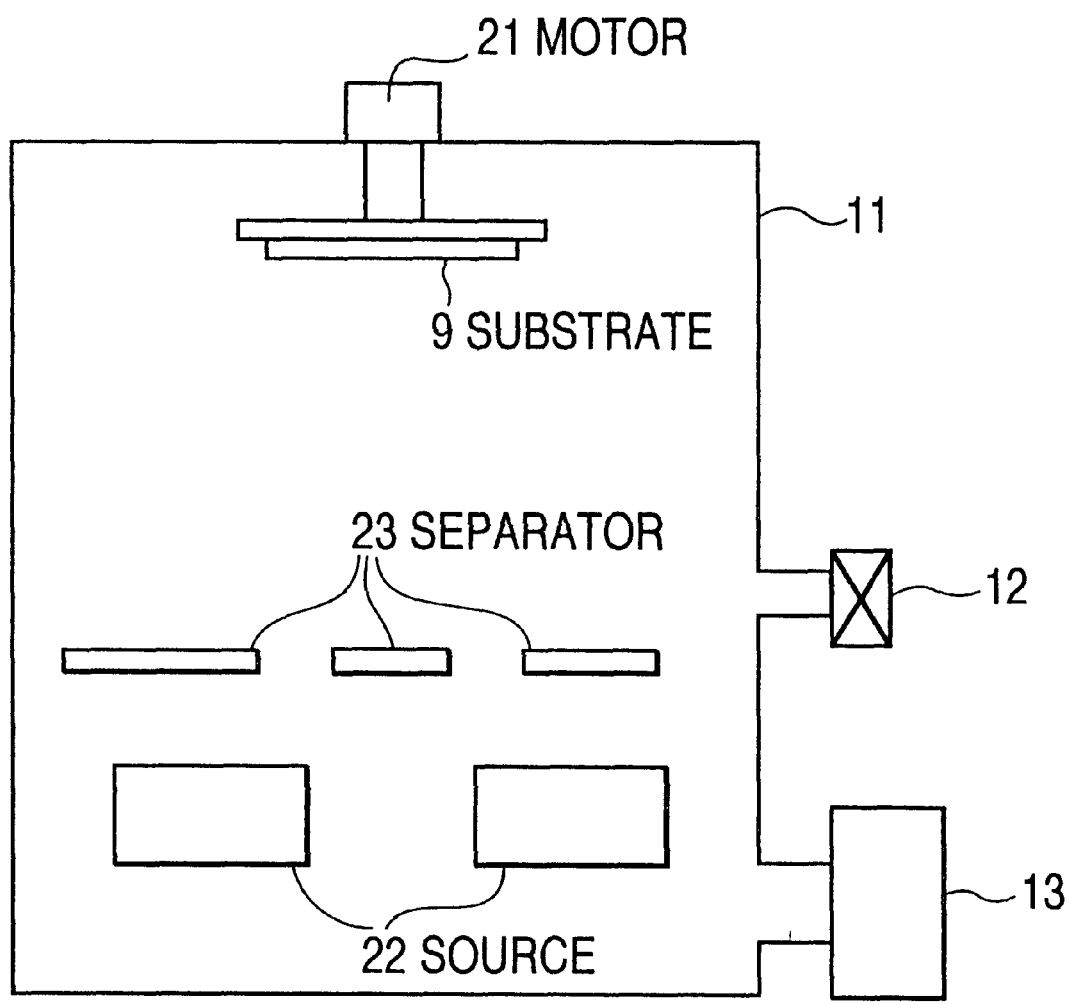
FIG. 17 is a schematic view showing a conventional sputtering apparatus.

Many samples having the same thin film construction as shown FIG. 7 was formed by means of sputtering method and tested. The result is shown in FIG. 16, in which the reflectance difference 66 R dependency on the compositional is indicated by method of equal altitude. From FIG. 3, it is understood that change of the composition along the line A-B connecting the point of GeTe and the point of Sb2Te3 makes the crystallization velocity vary and, from FIG. 16, change of the composition makes the reflectance difference ΔR to be changed very much.

Contrary to this, if Sb is added to an optional composition on the line A-B, the difference ΔR changes scarcely. That means that it is possible to adjust only the crystallization velocity as shown in FIG. 3 without change of the difference ΔR.

If the Sb content is too much, the crystallization time becomes longer as seen from FIG. 3. Measured according to Japanese Journal of Applied Physics, Vol.26(1987) Supplement 26-4, page 26, the material belonging to right side of the line C-D, that is, containing less than Te 45% has the crystallization of more than 1 μs, which indicates not suitable for the recording material of the optical disk.

The composition close to Sb2Te3 has a small difference ΔR in FIG. 16, because the thin film construction is not fitted to change of the complex index of refraction. Therefore, if optimization of thickness of each thin films would be done, ΔR can be made to a large value of more than 20%. In this case, ΔR in the composition close to GeTe becomes small. That is, even if the composition changes from the point B to the point C by further adding Sb, optimization of the optical disk construction makes ΔR to be more than 20% at all the region, resulting in good signal quality.

Even if change of the composition is made along the line connecting GeTe and Sb2Te3 from the inside area to the outside area in the disk in order to change the crystallization velocity, change of the thin film thickness makes all the disk region to have a large reflectance change. However, it is difficult in mass production.

Seen from FIG. 3, the farther from the line connecting GeTe and Sb2Te3 the composition is, the slower the crystallization is. Accordingly, change of the Te content under condition of the same compositional ratio between Ge and Sb makes the crystallization velocity to be changed. However, seen from FIG. 16, change of the Te content makes the optical constant to be changed largely, resulting in large change of reflectance between the inside area and the outside area. It is a problem.

EXAMPLE 5

In the case of GeSbTe ternary alloy, addition effect of another elements thereto is investigated in relation between the additional amount of the elements and the reflectance difference ΔR and also the crystallization time.

Measurement of ΔR is the same as Example 4. The crystallization time is measured according to Japanese Journal of Applied Physics, Vol.26(1987) Supplement 26-4, page 26.

The result in the case of the H point composition in FIG. 8 adjusted by adding the other elements is indicated in the below Table 5. As seen from the Table, addition of Pd, Co or Se to the GeSbTe alloy makes the crystallization velocity slower in all the case. However, addition of more than 20% of the other element makes the crystallization time to be more than 1 μm or makes the reflectance difference ΔR to be smaller. It is recommendable to add 20% or less of the other element.

In the case of using one or more selected from the group comprising Ni, Ti, In, Au, Cr or Ag as the other element, it is confirmed that the similar effect as above can be obtained. More than two elements can be added at the same time.

Figure 6:
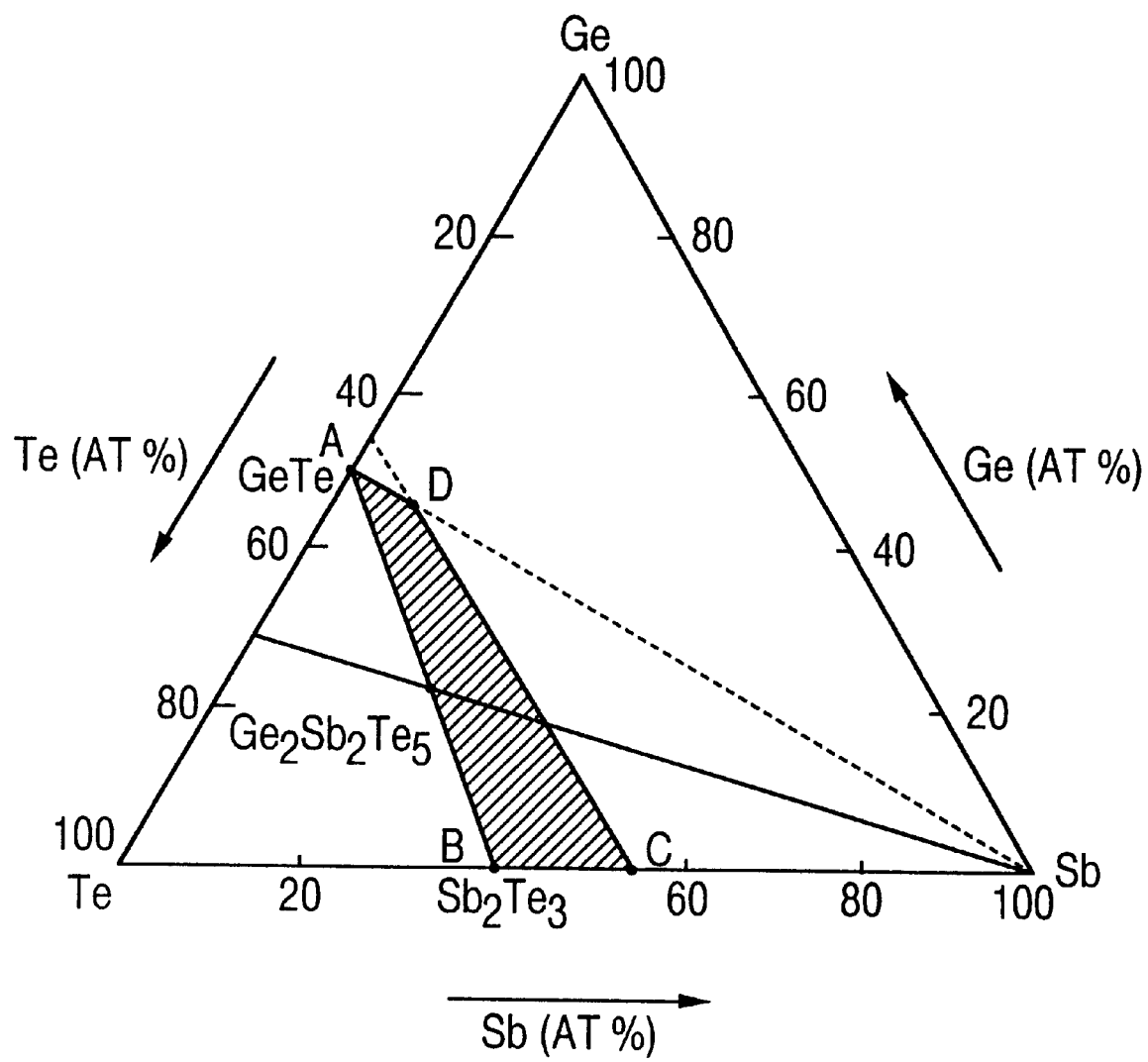
FIG. 6 shows an effective compositional region used for PCE optical recording film in GeSbTE ternary system.

Further, it is confirmed that all compositions except the point H as long as they belong to the scope enclosed by the four points A, B, C and D in FIG. 6 makes the crystallization velocity to be slower without any substantial change of the reflectance difference ΔR.

TABLE 5

| Element | Amount (at %) | crystallization time (ns) | ΔR (%) |
|---|---|---|---|
| nothing | 0 | 200 | 24 |
| Pd | 5 | 300 | 23 |
| Pd | 10 | 500 | 23 |
| Pd | 20 | 700 | 22 |
| Pd | 30 | 1500 | 21 |
| Co | 5 | 300 | 22 |
| Co | 10 | 400 | 22 |
| Co | 20 | 700 | 20 |
| Co | 30 | 1000 | 13 |
| Se | 5 | 300 | 23 |
| Se | 10 | 500 | 22 |
| Se | 20 | 1000 | 21 |
| Se | 30 | 2000 | 17 |

EXAMPLE 6

By using the sputtering apparatus shown in FIG. 9, the optical disk is prepared and the record signal erasing characteristic is measured. In FIG. 9, the inside target size is an outer diameter of 66 mm, an inner diameter of 34 mm, a thickness of 6 mm while the outside target size is an outer diameter of 142 mm, an inner diameter of 108 mm, a thickness of 6 mm. The composition of the inside target is the point J in FIG. 8 and that of the outside target is the point I of FIG. 8. The inside and the outside targets can be independently controlled.

The substrate is a polycabonate one provided with trucks for recording signal and is at standstill and opposite to the targets. The substrate is pre-coated by a dielectric layer of ZnS—SiO2 having a thickness of 174 nm.

After exhausting through exhaust system 13 in an interior of a vacuum chamber 11 up to 3×10−7 Torr, Ar gas is introduced therein through a gas inlet 12 up to 3 mTorr. Under the atmosphere, the recording film having a thickness of 30 nm is formed on the substrate. After then, ZnS—SiO2 layer having a thickness of 23 nm and Al reflective layer having a thickness of 100 nm are formed. On the surface there is over-coated a UV resin to give an optical disk. The optical disk is initiated by irradiating the laser on the disk to change an amorphous state into a crystal state. This is a first disk I. It is confirmed by analysis of the ICP method that the disk has the point H composition at the most inside region, around a radius of 25 mm and the point G at the most outside region, around a radius of 60 mm.

As comparative samples, three kinds of the optical disks are prepared with the same construction as the disk I but different compositions. A second disk II has a uniform composition same as the point H at the most inside area of the disk I. A third disk III has a uniform composition same as the point G at the most outside area of the disk I. A fourth disk IV has a middle composition of the point K between the points G and H. The sample disks I to IV are subjected to a record regenerative characteristic measuring by means of measuring apparatus provided with wavelength of 780 nm and objective numerical aperture of 0.55.

Evaluation of record regenerative characteristic is done according the following procedure. Each the optical disks is set on the apparatus for signal regenerating and a spindle motor is rotated at the constant 800 rpm. The optical beam from a semiconductor laser is irradiated as a small spot to the recording thin layer and subjected to a focus and tracking control.

Firstly at position of radius 25 mm, frequencies f1 (0.785 MHz) and f2 (0.589 MHz) are alternately overwritten 20 times by means of Duty 50%, and CNR (Signal/Noise Ratio) of f1 and Erasing rate of f1 component when f2 is overwritten on f1 are looked for. Measurement is done at recording power when CNR is saturated and erasing power when the maximum erasing rate is obtained, wherein the linear velocity is 4.71 m/s and the recording mark length are 3.0 μm at f1 and 4.0 μm at f2.

Secondly at position of radius 60 mm, frequencies f3 (1.885 MHz) and f4 (0.1.414 MHz) are alternately overwritten 20 times by means of Duty 50%. CNR (Signal/Noise Ratio) of f3 and Erasing rate of f3 component when f4 is overwritten on f3 are looked for. Measurement is done at recording power when CNR is saturated and erasing power when the maximum erasing rate is obtained, wherein the linear velocity is 11.31 m/s and the recording mark length are 3.0 μm at f1 and 4.0 μm at f2.

The result is indicated in the below Table 6. From the Table, it can be seen that the most inside and the most outside area in the disk I according to the present invention have a good record/erase chacteristic. Contrary to this, the disk II has not a sufficient erasing rate at the outside area because of slower crystallization. The disk III has a small CNR at the inside area because it is believed that the crystallization velocity is too faster to have a sufficient amorphous recording mark. In the case of the disk IV, lowered CNR at the inside area and insufficient erase at the outside area can be observed because the crystallization velocity is too fast at the inside area and is too slower at the outside area.

Additionally in the case of the disk I, a good CNR can be obtained at the inside and the outside area because the difference between the inside and the outside area in relation to the complex index of refraction is small so that the reflective difference ΔR of the inside is substantially equal to that of the outside.

TABLE 6

|  | r = 25 mm | | r = 60 mm | |
| --- | --- | --- | --- | --- |
|  | CNR (dB) | Erase rate (dB) | CNR (dB) | Erase rate (dB) |
| disk I | 59.5 | −32.4 | 60.2 | −31.5 |
| disk II | 59.1 | −32.7 | 58.2 | −18.4 |
| disk III | 46.0 | −27.6 | 60.6 | −31.0 |
| disk IV | 52.0 | −29.3 | 59.7 | −22.5 |

EXAMPLE 7

By using an sputtering apparatus shown in FIG. 14. optical disk are prepared and the record/erase characteristic is measured.

Target has a diameter of 200 mm and is divided concentrically at a diameter of 80 mm. The inside area of target is the point M of FIG. 8 and the outside area is the point L of FIG. 8. The both compositions are sputtered from the inside and the outside area of target at the same time.

Except the substrate shape and the recording film composition, the same thin film construction, each layer thickness, forming condition and initiating method as Example 6 are used. Further, the substrate is at a standstill and opposite to the target at the position of 40 mm above the target. This is a fifth disk V.

Figure 8:
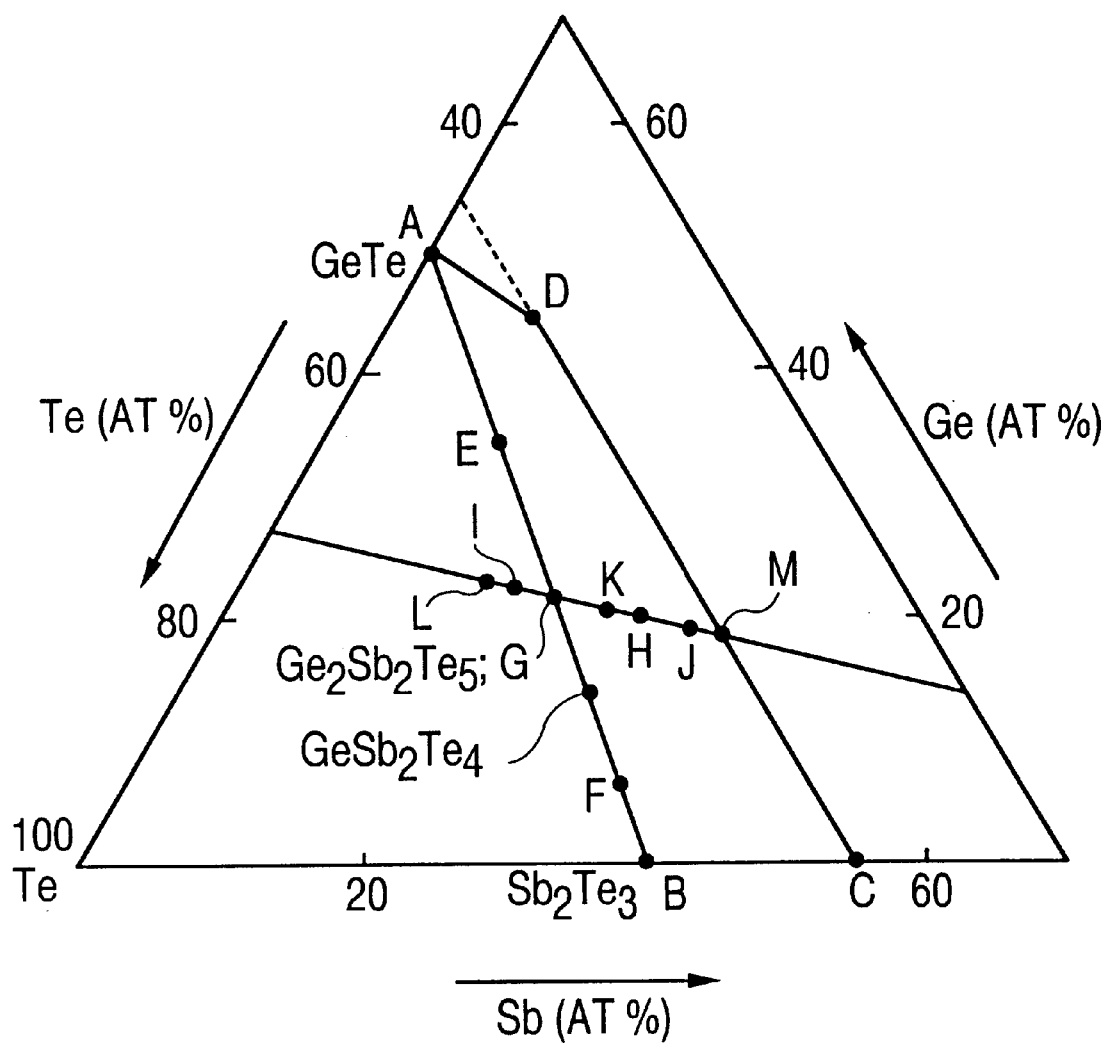
FIG. 8 shows the compositional region in GeSbTe ternary system used for the targets and the recording film used in Examples.

It is confirmed by analysis of ICP method that, the most inside area, around a radius of 25 mm, has a composition of the point H of FIG. 8 and the most outside area, around a radius of 60 mm, has a composition of the point G of FIG. 8 as long as the forming condition is the same as that of the disk V.

The record/erase characteristic is measured in a same manner of Example 6. As a result, the most inside area of the disk V has a CNR of 59.8 dB and a Erasing rate of −31.9 dB while the most outside area has a CNR of 60.5 dB and a Erasing rate of −31.0 dB. It can be seen that the most inside and the most outside area in the disk I according to the present invention have a good record/erase characteristic Comparative Example 1

A sixth disk VI are prepared in a same manner as Example 6 except the inside area of the optical disk is a composition of the point E of FIG. 8 and the outside area of the disk is a composition of the point F of FIG. 8. Evaluation method is done according to Example 6. However, the disk VI has a faster crystallization velocity compared with the disk I, so that the disk rotation number is set to 2400 rpm which is 1.33 times of that of Example 6. The frequencies f1 to f4 have a 1.33 times of that, so the same recording mark length is equal to that of Example 6.

As a result of measurement, the most inside area of the disk VI has a CNR of 62.5 dB and a Erasing rate of −32.7 dB while the most outside area has a CNR of 52.3 dB and a Erasing rate of −31.1 dB. It can be seen that the most inside and the most outside area in the disk I according to the present invention have a good record/erase characteristic. However, while the CNR is good at the most inside area, it is small at the most outside area. Microscope observation shows sufficient large amorphous recording mark formed. Therefore, it is believed that the reason that the most outside area has a small CNR is due to a small reflectance difference ΔR.

In FIG. 8, the points A to M have the following at % content of Ge, Sb and Te.

A:(Ge, Sb, Te)=(50, 0, 50)
B:(Ge, Sb, Te)=(0, 40, 60)
C:(Ge, Sb, Te)=(0, 55, 45)
D:(Ge, Sb, Te)=(45, 10, 45)
E:(Ge, Sb, Te)=(35, 12, 53)
F:(Ge, Sb, Te)=(7, 35, 58)
G:(Ge, Sb, Te)=(22, 22, 51)
H:(Ge, Sb, Te)=(20, 29, 51)
I:(Ge, Sb, Te)=(23, 20, 57)
J:(Ge, Sb, Te)=(19, 34, 47)
K:(Ge, Sb, Te)=(21, 26, 53)
L:(Ge, Sb, Te)=(23, 19, 58)
M:(Ge, Sb, Te)=(18, 36, 46)

Apparent from the above explanation, the disk according to the present invention has an increased crystallization velocity from the inside area to the outside area without any significant changed amplitude of regeneration if required, so that a good record/erase and regenerative characteristic can be obtained under the constant angular velocity of the disk. Accordingly, all the region of the disk have a high quality for recording the signal and can realize a high speed access.

Further, according to the present invention method, the high performance disk can be provided at high speed production.

What is claimed is:

1. An optical information recording disk comprising a recording film deposited on a substrate, said recording film consists essentially of a material which is reversibly phase changeable between an amorphous phase and a crystal phase upon irradiation with a laser beam, wherein the phase changeable recording film comprises at least three alloy components Ge, Te and Sb having an atom % ration enclosed by the following four points in an area of a ternary diagram of FIG. 6; (Ge,Sb,Te)= (50,0,50), (0,40,60), (0,55,45) and (45,10,45).

2. The optical information recording disk according to claim 1, wherein the phase changeable recording film comprises three alloy components Ge, Te and Sb, wherein the compositional atom % ratio of Te and Ge is about 2:5.

3. An optical information recording disk comprising a recording film deposited on a substrate, said recording film consists essentially of a material which is reversibly phase changeable between an amorphous phase and a crystal phase upon irradiation with a laser beam, wherein the phase changeable recording film comprises at least three alloy components Ge, Te and Sb having an atom % ratio enclosed by the following four points in an area of a ternary diagram of FIG. 6; (Ge,Sb,Te)= (50,0,50), (0,40,60), (0,55,45) and (45,10,45), wherein the compositional atom % ratio of Te and Ge is about constant, wherein the Sb content is decreased in a radial direction from inside area to outside area of the disk.

4. The optical information recording disk according to claim 3, wherein the phase changeable recording film comprises three alloy components Ge, Te and Sb, wherein the compositional atom % ratio of Te and Ge is about 2:5.

5. An optical information recording disk comprising a recording film deposited on a substrate, said recording film consists essentially of a material which is reversibly phase changeable between an amorphous phase and a crystal phase upon irradiation with a laser beam, wherein the phase changeable recording film comprises at least three alloy components Ge, Te and Sb and further at least one additional component, wherein the additional component content is decreased in a radial direction from inside area to outside area of the disk.

6. The optical information recording disk according to claim 5, wherein the one additional component is selected from the group consisting of Pd, Co, Ni, Ti, Se, In, Au, Ag and Cr.

7. The optical information recording disk according to claim 6, wherein the additional component content is 20 atom % of less.

* * * * *